(12) United States Patent
Higuchi et al.

(10) Patent No.: US 6,380,614 B1
(45) Date of Patent: Apr. 30, 2002

(54) NON-CONTACT TYPE IC CARD AND PROCESS FOR MANUFACTURING SAME

(75) Inventors: Tsutomu Higuchi; Tomoharu Fujii; Shigeru Okamura; Tsuyoshi Sato; Takayoshi Wakabayashi; Masatoshi Akagawa, all of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/602,073

(22) Filed: Jun. 23, 2000

(30) Foreign Application Priority Data

Jul. 2, 1999 (JP) .............................. 11-188616
Jan. 6, 2000 (JP) ....................... 2000-000598

(51) Int. Cl.$^7$ .............................................. H01L 23/02
(52) U.S. Cl. ..................... 257/679; 257/787; 257/492; 257/380; 257/451; 361/737
(58) Field of Search ................. 257/679, 787; 361/737; 235/492, 380, 451

(56) References Cited

U.S. PATENT DOCUMENTS 5,244,840 A * 9/1993 Kodai et al. ................. 235/492
5,321,240 A * 6/1994 Takihara ....................... 235/380
5,416,358 A * 5/1995 Ochi et al. .................... 257/675
5,952,713 A * 9/1999 Takahira et al. ............. 257/679
6,181,001 B1 * 1/2001 Ikefuji et al. ................ 257/679

FOREIGN PATENT DOCUMENTS

JP    4-103399   *  4/1992
JP    7-182470   *  7/1995

* cited by examiner

*Primary Examiner*—Jhihan B. Clark
(74) *Attorney, Agent, or Firm*—Pennie & Edmonds, LLP

(57) ABSTRACT

An IC card comprises: a plane coil having respective terminal sections; a semiconductor element arranged at a position not overlapping with the plane coil, the semiconductor element having electrode terminals; means for electrically connecting the respective terminal sections of the plane coil to the electrode terminals of the semiconductor element; and a reinforcing frame arranged on a face substantially the same as that of the semiconductor element so that the semiconductor element is surrounded by the reinforcing frame.

9 Claims, 7 Drawing Sheets

NON-CONTACT TYPE IC CARD AND PROCESS FOR MANUFACTURING SAME

BACKGROUND OF THE INVENTION

1. Field of the Invention

The present invention relates to a non-contact type IC card including a plane coil and a semiconductor element arranged at a position not overlapping with the plane coil, wherein the terminal sections of the plane coil are electrically connected with the electrode terminals of the semiconductor element. Further, the present invention relates to a process for manufacturing the non-contact type IC card. Furthermore, the present invention relates to the plane coil used for the non-contact type IC card.

2. Description of the Related Art

Referring to FIG. 8, the structure of a conventional non-contact type IC card 50 will be explained below.

The plane coil 52 is manufactured by winding a covered conductor wire, etching a layer of metallic foil formed on a resin film or punching a metallic sheet.

In order to reduce the thickness of the non-contact type IC card 50, the semiconductor element 54 is arranged in the substantially same plane as that of the plane coil 52 at a position not overlapping with the plane coil 52. The electrode terminals 56 of the semiconductor element 54 are electrically connected with the terminal sections 52a of the plane coil 52 by wires 58. In this case, bonding wires and covered wires are included in the implications of the "wires" in this specification hereinafter.

Then, a pair of over-sheets 60 made of resin are attached onto both sides of the plane coil 52 and semiconductor element 54. After that, the over-sheets 60 are heated and pressed, so that they can be integrated into one body. In this way, the non-contact type IC card 50 can be made. In this connection, when the wires 58 are composed of bonding wires, insulating material such as an insulating sheet is interposed between the wires 58 and the plane coil 52 so that an electrical insulating property can be ensured.

In the above arrangement, the thickness of the non-contact type IC card 50 is reduced by arranging the plane coil 52 and the semiconductor element 54 in such a manner that they are not overlapped with each other. However, in order to further reduce the thickness of the non-contact type IC card 50, the thickness of the plane coil 52 itself and that of the semiconductor element 54 itself must be further reduced.

However, when the thickness of the plane coil 52 and that of the semiconductor element 54 are reduced, the mechanical strength of each component is deteriorated. This deterioration of the mechanical strength causes a serious problem. Especially, this deterioration of the mechanical strength causes a serious problem in the semiconductor element 54, that is, when an external force is given to the semiconductor element 54, there is a high possibility of damage to, or cracks in, the semiconductor element 54.

SUMMARY OF THE INVENTION

The present invention has been accomplished to solve the above problems. It is an object of the present invention to provide a non-contact type IC card, the thickness of which is small, which is less susceptible to damage.

According to the present invention, there is provided an IC card comprising: a plane coil having respective terminal sections; a semiconductor element arranged at a position not overlapping with the plane coil, the semiconductor element having electrode terminals; means for electrically connecting the respective terminal sections of the plane coil to the electrode terminals of the semiconductor element; and a reinforcing frame arranged on a same face as that of the semiconductor element so that the semiconductor element is surrounded by the reinforcing frame.

Due to the foregoing, the semiconductor element is arranged inside the reinforcing frame. In other words, the semiconductor element is surrounded by the reinforcing frame. Therefore, the semiconductor element is protected when an external force is given to the semiconductor element. Accordingly, even if the thickness of the semiconductor element is reduced, no problems are caused, that is, there is no possibility that the semiconductor element is damaged.

If the reinforcing frame is composed in such a manner that the terminal sections of the plane coil are formed into a frame-shape, it becomes unnecessary to provide the reinforcing frame separately from the plane coil. Therefore, the number of parts can be reduced.

If the inside region of the reinforcing frame is filled with resin material by using the reinforcing frame as a guide, the semiconductor element can be protected by the resin, so that the possibility of damage of the semiconductor element can be reduced.

If the semiconductor element is arranged inside the plane coil, the dimensions of the non-contact type IC card can be reduced, which is advantageous for use in various technical fields in which small non-contact type IC cards are required.

The reinforcing frame comprises the respective terminal sections which constituted a frame-like configuration.

An inside region of the reinforcing frame is filled with a resin.

The semiconductor element is arranged at a position inside the plane coil.

The electrical connecting means comprises a circuit board extending from the terminal sections of the plane coil to the electrode terminals of the semiconductor element, the circuit board comprising an insulating resin film having first and second surfaces, the first surface facing to the semiconductor element, and circuit patterns formed on the second surface of the insulating resin film; and conductive bumps formed on the terminal sections of the plane coil and on the electrode terminals of the semiconductor element, respectively, the bumps projecting through the insulating resin film to the circuit patterns, so that the terminal sections of the plane coil are electrically connected to the electrode terminals of the semiconductor element by means of the circuit patterns.

Otherwise, the electrical connecting means comprises: an insulating resin film extending from the terminal sections of the plane coil to the electrode terminals of the semiconductor element, the insulating resin film having first and second surfaces, the first surface facing to the semiconductor element, the insulating resin film also having through holes at positions corresponding to the terminal sections of the plane coil and the electrode terminals of the semiconductor element; and circuit patterns, composed of conductive paste, formed on the second surface of the insulating resin film and having respective ends filled in the through holes, respectively, so that the terminal sections of the plane coil are electrically connected to the electrode terminals of the semiconductor element by means of the circuit patterns.

In another embodiment, an IC card further comprises an electrically insulating layer for covering the reinforcing frame, the semiconductor element and the plane coil, at a side of the electrode terminals of the semiconductor element; the electrical connecting means comprising:

an insulating resin film formed on said insulating layer extending from the terminal sections of the plane coil to the electrode terminals of the semiconductor element; the insulating resin film having first and second surfaces, the first surface facing to the semiconductor element;

the electrical insulating layer and the insulating resin film having through holes, penetrating therethrough, at positions corresponding to the terminal sections of the plane coil and the electrode terminals of the semiconductor element; and circuit patterns, composed of conductive paste, formed on the second surface of the insulating resin film and having respective ends filled in the through holes, respectively, so that the terminal sections of the plane coil are electrically connected to the electrode terminals of the semiconductor element by means of the circuit patterns.

The electrical connecting means comprises: an insulating resin thin film extending from the terminal sections of the plane coil to the electrode terminals of the semiconductor element, the insulating resin film having first and second surfaces, the first surface facing the semiconductor element; the insulating resin film having relief portions at positions corresponding to the terminal sections of the plane coil and the electrode terminals of the semiconductor element; circuit patterns, composed of conductive metal foil, formed on the second surface of the insulating resin film and having respective portions pushed toward the terminal sections of the plane coil and the electrode terminals of the semiconductor element through the relief portions of the insulating resin film, so that the terminal sections of the plane coil are electrically connected to the electrode terminals of the semiconductor element by means of the circuit patterns.

According to another aspect of this invention, there is also provided a process for manufacturing a non-contact type IC card, the process comprising the following steps of:

forming respective conductive bumps on the terminal sections of the plane coil and on the electrode terminals of the semiconductor element;

arranging the semiconductor element on a face substantially the same as that of the reinforcing frame so that the semiconductor element is surrounded by the reinforcing frame;

covering the reinforcing frame, the semiconductor element and the plane coil with an insulating layer at a side of the electrode terminals of the semiconductor element;

extending a circuit board from the terminal sections of the plane coil to the electrode terminals of the semiconductor element, the circuit board comprising an insulating thin film having first and second surfaces and circuit patterns formed on the second surface of the insulating thin film, so that the first surface faces to the semiconductor element; and heating and pressing the circuit board so that the conductive bumps penetrate through the insulating thin film of the circuit board and thus the terminal sections of the plane coil are electrically connected to the electrode terminals of the semiconductor element.

Another process for manufacturing a non-contact type IC card comprises the following steps of:

arranging the semiconductor element on a face substantially the same as that of the reinforcing frame so that the semiconductor element is surrounded by the reinforcing frame;

extending an insulating resin film from the terminal sections of the plane coil to the electrode terminals of the semiconductor element, the insulating resin film having first and second surfaces and having through holes at positions corresponding to the terminal sections of the plane coil and the electrode terminals of the semiconductor element, so that the first surface faces the semiconductor element;

coating the second surface of the insulating resin film with a conductive paste between the through holes exposing the terminal sections of the plane coil and the electrode terminals of the semiconductor element, respectively; and heating and hardening the conductive paste to form circuit patterns so that the terminal sections of the plane coil are electrically connected to the electrode terminals of the semiconductor element.

Still another process for manufacturing a non-contact type IC card comprises the following steps of:

arranging the semiconductor element on a face substantially the same as that of the reinforcing frame so that the semiconductor element is surrounded by the reinforcing frame;

covering the reinforcing frame, the semiconductor element and the plane coil with an insulating layer at a side of the electrode terminals of the semiconductor element;

forming an insulating resin film on the insulating layer, the insulating resin film having first and second surfaces, so that the first surface faces the semiconductor element and insulating resin film extends from the terminal sections of the plane coil to the electrode terminals of the semiconductor element;

providing the electrically insulating layer and the insulating resin film with through holes, penetrating therethrough, at positions corresponding to the terminal sections of the plane coil and the electrode terminals of the semiconductor element;

coating the second surface of the insulating resin film with conductive paste between the through holes exposing the terminal sections of the plane coil and the electrode terminals of the semiconductor element, respectively; and heating and hardening the conductive paste to form circuit patterns so that the terminal sections of the plane coil are electrically connected to the electrode terminals of the semiconductor element.

A further process for manufacturing a non-contact type IC card comprises the following steps of:

arranging the semiconductor element on a face substantially the same as that of the reinforcing frame so that the semiconductor element is surrounded by the reinforcing frame;

extending an insulating resin thin film from the terminal sections of the plane coil to the electrode terminals of the semiconductor element, the insulating resin film having relief portions at positions corresponding to the terminal sections of the plane coil and the electrode terminals of the semiconductor element, and circuit patterns, composed of conductive metal foil, formed on the second surface of the insulating resin film;

locally pushing the circuit patterns toward the terminal sections of the plane coil and the electrode terminals of the semiconductor element through the relief portions of the insulating resin film, and applying ultrasound to the pushed portions of the circuit patterns, so that the pushed portions come into contact with the terminal sections of the plane coil and the electrode terminals of the semiconductor element and thus electrically connecting therebetween by means of the circuit patterns.

According to still another aspect of this invention, there is provided a plane coil adapted to be used in a non-contact type IC card including at least one semiconductor element, the plane coil comprising: respective terminal sections, at least one of the terminal sections being formed as a reinforcing frame, so that the semiconductor element can be arranged in such a manner that the semiconductor element is surrounded by the reinforcing frame.

DETAILED DESCRIPTION OF THE EMBODIMENTS

Figure 1:
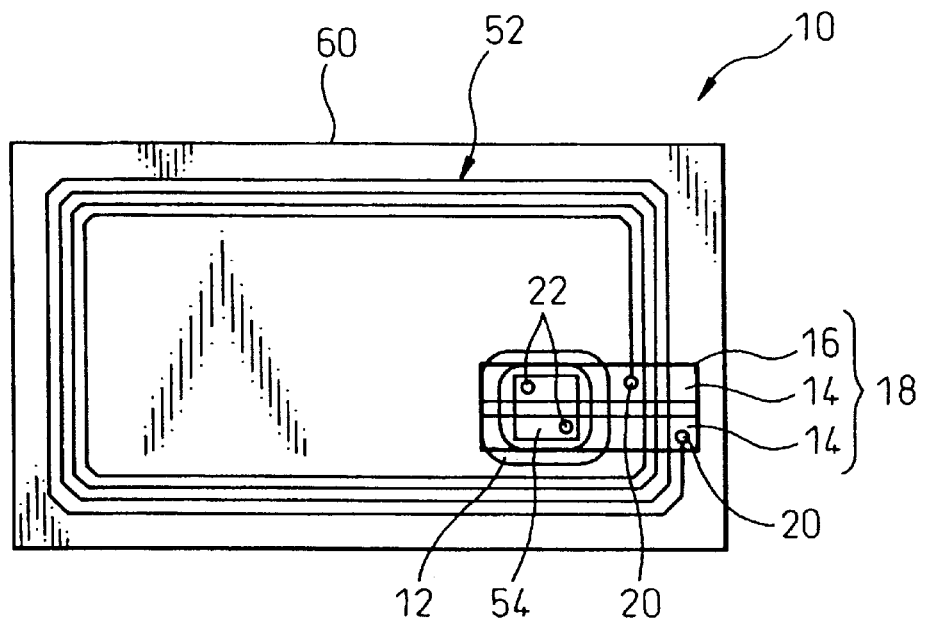
FIG. 1 is a schematic illustration for explaining the structure of the first embodiment of the non-contact type IC card of the present invention.

Referring now to the appended drawings, a preferred embodiment of the non-contact type IC card of the present invention will be explained in detail as follows. In this connection, like reference characters are used to indicate like parts in the embodiment of the present invention and the conventional example.

(First Embodiment)

Figure 2A:
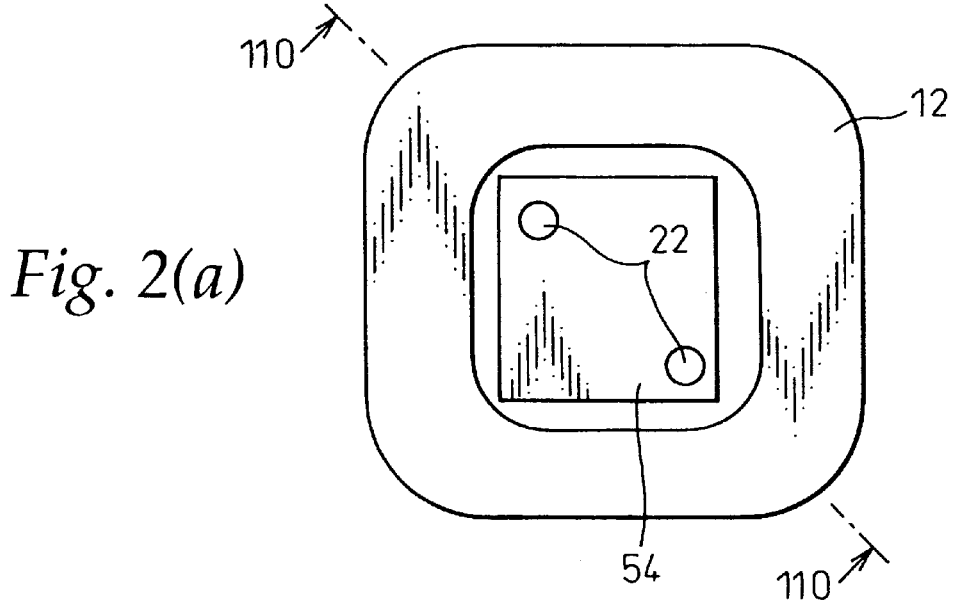
FIG. 2(a) is an enlarged plan view showing an outline of the structure of the semiconductor element and the reinforcing frame shown in FIG. 1.
Figure 2B:
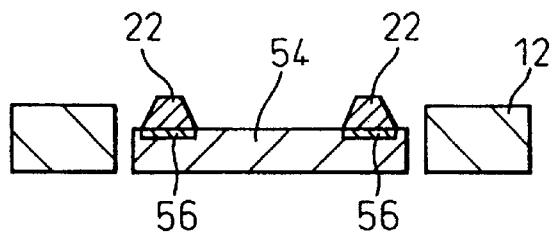
FIG. 2(b) is a cross-sectional view taken on line A—A in FIG. 2(a)
Figure 3:
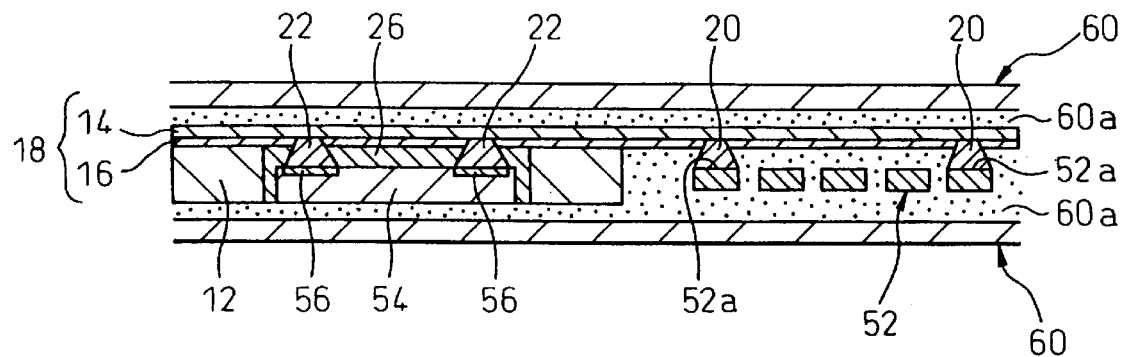
FIG. 3 is a cross-sectional view showing an outline of the inner structure of the non-contact type IC card shown in FIG. 1.

Referring to FIGS. 1 to 3, the structure of the non-contact type IC card 10 will be explained below.

Although the plane coil 52 can be manufactured by various manufacturing processes, the plane coil 52 manufactured by punching or etching a thin metallic sheet is preferable for the non-contact type IC card 10 of the present invention.

In order to reduce the thickness of the non-contact type IC card 10, the thickness of the semiconductor element 54 is reduced, and the semiconductor element 54 is arranged on substantially the same face as that of the plane coil 52 at a position where the semiconductor element 54 does not overlap with the plane coil 52. For example, the thickness of the semiconductor element 54 is approximately 30 to 50 $\mu$m. In this embodiment, in order to reduce the size of the non-contact type IC card, the semiconductor element 54 is arranged close to the plane coil 52 in the inside region of the plane coil 52. However, it is also possible to arrange the semiconductor element 54 in the outside region of the plane coil 52.

The semiconductor element 54 is arranged inside the reinforcing frame 12 arranged on the same face as that of the semiconductor element 54. In other words, the reinforcing frame 12 is arranged in the periphery of the semiconductor element 54. The thickness 12 of the reinforcing frame 12 is substantially the same as the thickness of the semiconductor element 54 or is somewhat larger than the thickness of the semiconductor element 54.

It is necessary that the mechanical strength and the rigidity of the reinforcing frame 12 are higher than those of the semiconductor element 54. Therefore, the reinforcing frame 12 is made of, for example, a thin metallic sheet, a thin ceramic sheet or a rigid resin material. The profile of the inner circumferential face of the reinforcing frame 12 is somewhat larger than the outer profile of the semiconductor element 54, so that a large gap can not be formed between the inner circumferential face of the reinforcing frame 12 and the outer edge of the semiconductor element 54.

Next, explanations will be made into the electrically connecting structure between the electrode terminals 56 of the semiconductor element 54 and the terminal sections 52a of the plane coil 52.

The wiring board 18 composed of the insulating resin film body 16, one side of which is directed to the semiconductor element 54 side, on the other side of which two wiring patterns 14 are formed, is arranged between the terminal sections 52a of the plane coil 52 and the electrode terminals 56 of the semiconductor element 54 on the electrode terminal 56 side of the semiconductor element 54.

The bumps 20, 22 protruding to the wiring board 18 side are respectively formed in the terminal sections 52a of the plane coil 52 and the electrode terminals 56 of the semiconductor element 54.

A pair of over-sheets 60, on one side of which the adhesive layer 60a is formed, are attached onto both sides of the plane coil 52, semiconductor element 54 and wiring board 18 in such a manner that the adhesive layers 60a of the over-sheets 60 are directed to the plane coil 52 side. Then, the over-sheets 60 are heated and pressed so that they can be integrated into one body. As shown in FIG. 3, when the over-sheets 60 are heated and pressed in this way, a tip portion of each bump 20, 22 penetrates the insulating resin film body 16 of the wiring board 18 and comes into electrical contact with the wiring pattern 14. Due to the foregoing, the terminal sections 52a of the plane coil 52 and the electrode terminals 56 of the semiconductor element 54 are electrically connected with each other.

In this connection, in the same manner as that of the conventional example, it is possible to electrically connect the terminal sections 52a of the plane coil 52 with the electrode terminals 56 of the semiconductor element 54 by the wires 58 in this embodiment. However, the above structure in which the wiring board 18 is used is advantageous because the two terminal sections 52a can be respectively connected with the two electrode terminals 56 at the same time, so that the number of manufacturing steps can be reduced.

The process for manufacturing this non-contact type IC card 10 is described as follows. First, when the plane coil 52 and the semiconductor element 54 are manufactured, the bumps 20, 22 protruding outward are respectively formed in the terminal sections 52a of the plane coil 52 and electrode terminals 56 of the semiconductor element 54.

Next, the reinforcing frame 12 is arranged in the periphery of the semiconductor element 54.

Specifically, first, the semiconductor element 54 is arranged at a position not overlapping with the plane coil 52 in the substantially same plane as that of the plane coil 52. After that, the reinforcing frame 12 is arranged in the periphery of the semiconductor element 54 in the same plane as that of the semiconductor element 54. In this connection, the reinforcing frame 12 may be arranged in the substantially same plane as that of the plane coil 52 at a position not overlapping with the plane coil 52, and the semiconductor element 54 may be arranged inside the reinforcing frame 12 in the same plane as that of the reinforcing frame 12.

Next, the wiring board 18 is arranged on the electrode terminal 56 side of the semiconductor element 54 while the other side of the wiring board 18 is directed to the semiconductor element 54 side in such a manner that the wiring board 18 is set between the terminal sections 52a of the plane coil 52 and the electrode terminals 56 of the semiconductor element 54.

Next, a pair of over-sheets 60, on one side of which the adhesive layer 60a is formed, are attached to the plane coil 52, semiconductor element 54 and wiring board 18 in such a manner that each adhesive layer 60a is directed onto the plane coil 52 side. Then, the pair of over-sheets 60 are heated and pressed so that they can be integrated into one body. Due to the foregoing, the plane coil 52, semiconductor element 54, reinforcing frame 12 and wiring board 18, which are interposed between the pair of over-sheets 60, are integrated into one body. When the wiring board 18 is pressed and heated, the bumps 22 penetrate the insulating resin film 16, and their tips come into electrical contact with the wiring pattern 14. In this connection, it is preferable that the portions of the insulating resin film 16 corresponding to the positions of the bumps 20, 22 are beforehand removed to form through holes, so that the wiring pattern 14 is exposed at the bottom surface of these through holes. Due to the foregoing, the terminal sections 52a of the plane coil 52 and the electrode terminals 56 of the semiconductor element 54 are electrically connected with each other by the wiring pattern 14.

(Second Embodiment)

This embodiment is the same as the first embodiment, except for the electrical connection structure of the terminal sections 52a of the plane coil 52 with the electrode terminals 56 of the semiconductor element 54 of the non-contact type IC card, as will be explained with reference to FIGS. 5 and 6.

The insulating resin film 16, on which the through-holes 24 are formed at positions corresponding to the terminal sections 52a of the plane coil 52 and the electrode terminals 56 of the semiconductor element 54, is arranged on the electrode terminal 56 side of the semiconductor element 54 while one of the faces of the insulating resin film 16 is directed to the semiconductor element 54 side in such a manner that the insulating resin film 16 is set between the terminal sections 52a of the plane coil 52 and the electrode terminals 56 of the semiconductor element 54.

Figure 5:
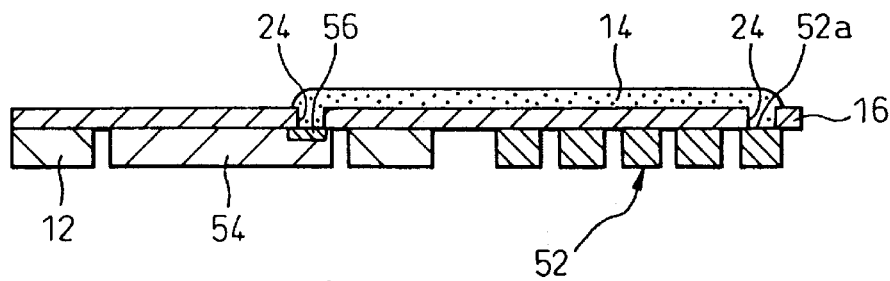
FIG. 5 is a schematic illustration showing a state in which the electrically conductive paste is coated and the wiring pattern is formed.

The wiring pattern 14, made of electrically conductive paste, both end portions of which are filled into the through-holes 24 which extend between the terminal sections 52a of the plane coil 52 and the electrode terminals 56 of the semiconductor element 54, is formed on the other face of the insulating resin film 16, that is, on the upper face shown in FIG. 5. Therefore, the terminal sections 52a of the plane coil 52 and the electrode terminals 56 of the semiconductor element 54 are electrically connected with each other.

Next, the process for manufacturing this non-contact type IC card will be explained.

First, the reinforcing frame 12 is arranged in the periphery of the semiconductor element 54. Specifically, first, the semiconductor element 54 is arranged at a position not overlapping with the plane coil 52 in substantially the same plane as that of the plane coil 52. After that, the reinforcing frame 12 is arranged so that the semiconductor element 54 can be located inside, that is, the semiconductor element 54 can be surrounded. As described in the first embodiment, the reinforcing frame 12 may be arranged in the substantially same plane as that of the plane coil 52 at a position not overlapping with the plane coil 52, and the semiconductor element 54 may be arranged inside the reinforcing frame 12 in the same plane as that of the reinforcing frame 12.

Figure 4:
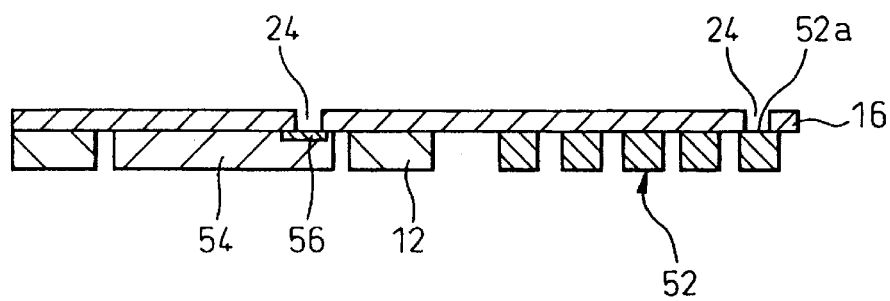
FIG. 4 is a schematic illustration for explaining an electrical connection structure between the electrode terminal of the semiconductor element and the terminal section of the plane coil of the second embodiment of the non-contact type IC card of the present invention, wherein this view shows a state before an electrically conductive paste is coated.

Next, as shown in FIG. 4, the insulating resin film 16, on which the through-holes 24 are formed at positions corresponding to the terminal sections 52a of the plane coil 52 and the electrode terminals 56 of the semiconductor element 54, is arranged on the electrode terminal 56 side of the semiconductor element 54 while one of the faces of the insulating resin film 16 is directed to the semiconductor element 54 side in such a manner that the insulating resin film 16 is set between the terminal sections 52a of the plane coil 52 and the electrode terminals 56 of the semiconductor element 54. Due to the foregoing, the electrode sections 52a and the electrode terminals 56 are exposed to the outside of the other face of the insulating resin film 16 from the through-holes 24.

Figure 6:
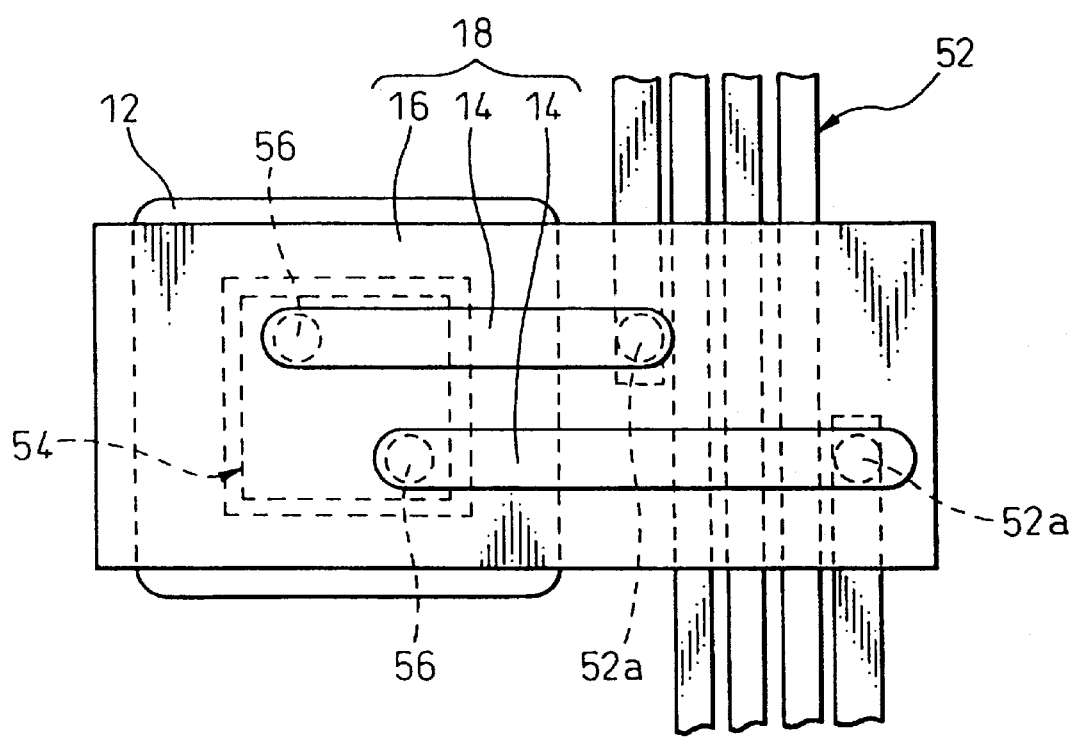
FIG. 6 is a plan view of FIG. 5.

Next, as shown in FIGS. 5 and 6, an electrically conductive paste is coated on the other face of the insulating resin film 16 by means of screen printing in such a manner that one end of the layer of paste reaches the through-holes 24 from which the electrode terminals 56 of the semiconductor element 54 are exposed and the other end of the layer of paste reaches the terminal sections 52a of the plane coil 52. In this case, the electrically conductive paste is filled into the through-holes 24. Therefore, the electrically conductive paste comes into contact with the terminal sections 52a and the electrode terminals 56 which are exposed from the through-holes 24. An example of the electrically conductive paste is a paste made of epoxy resin containing Ag filler.

Next, when the electrically conductive paste, which has been coated in this way, is heated and hardened, the wiring pattern 14 connecting the terminal sections 52a of the plane coil 52 with the electrode terminals 56 of the semiconductor element 54 can be formed.

Due to the foregoing, the wiring pattern 14 can be formed and both end portions extend to the terminal sections 52a of the plane coil 52 and the electrode terminals 56 of the semiconductor element 54, for electrically connecting the terminal sections 52a of the plane coil 52 with the electrode terminals 56 of the semiconductor element 54.

(Third Embodiment)

The structure of this embodiment is the same as that of the first embodiment, except for the electrical connection structure of the terminal sections 52a of the plane coil 52 with the electrode terminals 56 of the semiconductor element 54, as will be explained referring to FIG. 14.

Surfaces of the reinforcing frame 12, semiconductor element 54 and plane coil 52 on the side of the electrode terminal 56 of the semiconductor element 54 are covered with the insulating resin layer 62. Specifically, the insulating rein layer 62 is composed in such a manner that the insulating rein layer 62 is filled into a gap formed between the reinforcing frame 12 and the semiconductor element 54 and also filled into a gap formed in the plane coil 52 itself in the region including the reinforcing frame 12, semiconductor element 54 and terminal sections 52a of the plane coil 52.

On the surface of the insulating resin layer 62, that is, on the surface of the insulating resin layer 62 on the side of the terminal section 52a of the plane coil 52, the insulating resin film 16 is arranged at least between the terminal sections 52a of the plane coil 52 and the electrode terminals 56 of the semiconductor element 54. Specifically, the insulating resin film 16 is arranged so that the overall surface of the insulating resin layer 62 can be covered with the insulating resin film 16.

The through-holes 24 from which the terminal sections 52a and the electrode terminals 56 are exposed are formed at positions corresponding to the terminal sections 52a of the plane coil 52 and the electrode terminals 56 of the semiconductor element 54 on the insulating resin layer 62 and the insulating resin film 16.

The wiring pattern 14 made of electrically conductive paste, both end portions of which are filled into the through-holes 24, which extends between the terminal sections 52a of the plane coil 52 and the electrode terminals 56 of the semiconductor element 54, is formed on the surface of the insulating resin film 16. Therefore, the terminal sections 52a of the plane coil 52 and the electrode terminals 56 of the semiconductor element 54 are electrically connected with each other.

The structure in the plane view is substantially the same as that shown in FIG. 6.

The processes for manufacturing this non-contact type IC card will be explained below.

Figure 9:
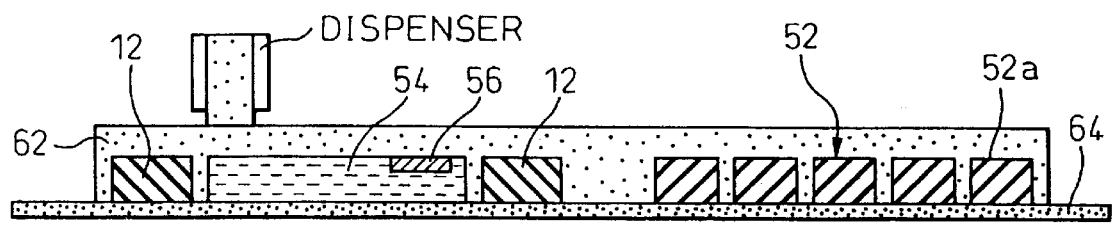
FIGS. 9 to 14 are schematic illustrations for explaining a process for manufacturing the third embodiment of the non-contact type IC card of the present invention.

First, as shown in FIG. 9, in the same manner as that of the first embodiment, the semiconductor element 54 is arranged inside the reinforcing frame 12 which is arranged on the same plane as that of the semiconductor element 54.

Reference numeral 64 denotes a base film. When the plane coil 52, semiconductor element 54 and reinforcing frame 12 are put on the same face as that of this base film 64, these members can be located on the same plane. This base film 64 may be finally interposed between the over-sheets 60 together with the semiconductor element 54 and the plane coil 52 so that these members can be formed into the non-contact type IC card. Alternatively, this base film 64 may be peeled and removed from the plane coil 52 before it is interposed between the over-sheets 60.

Next, as shown in FIG. 9, an ultraviolet-ray-setting type insulating resin is coated on the surfaces of the reinforcing frame 12, semiconductor element 54 and plane coil 52 on the side of the electrode terminal 56 of the semiconductor element 54 by a dispenser. In this way, the surfaces of the reinforcing frame 12, semiconductor element 54 and plane coil 52 are covered with the insulating resin layer 62.

Figure 10:
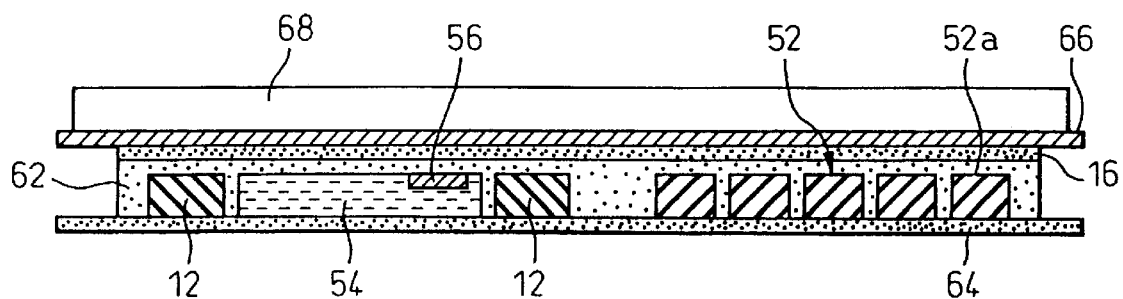

Next, as shown in FIG. 10, the insulating resin film 16 (for example, PET tape) is arranged on the surface of the insulating resin layer 62 in such a manner that one face of the insulating resin film 16 is directed to the semiconductor element 54 side and that the insulating resin film 16 is set at least between the terminal sections 52a of the plane coil 52 and the electrode terminals 56 of the semiconductor element 54. Specifically, the insulating resin film 16 is arranged so that it can cover the overall surface of the insulating resin layer 62. Then, the separation sheet 66 is laid on the surface of the insulating resin film 16, and the insulating resin film 16 is pushed by the plate of glass 68 via the separation sheet 66, so that the thickness of the insulating resin layer 62 provided on the surface of the plane coil 52 can be reduced.

Under the above condition, both sides of the reinforcing frame 12, semiconductor element 54 and plane coil 52 are irradiated with ultraviolet rays, so that the insulating resin layer 62 can be hardened.

Figure 11:
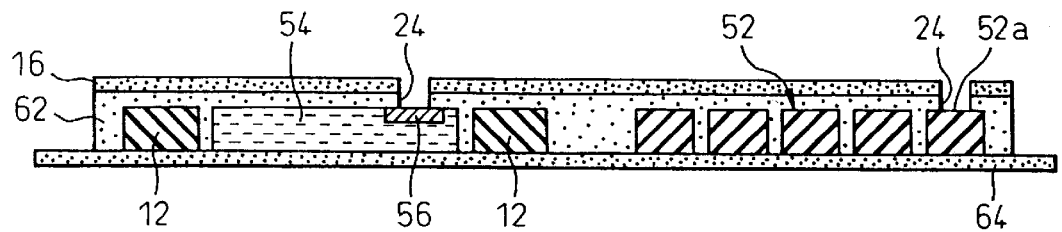

Next, as shown in FIG. 11, the through-holes 24, from which the terminal sections 52a of the plane coil 52 and the electrode terminals 56 of the semiconductor element 54 are exposed, are formed on the hardened insulating resin layer 62 and insulating resin film 16 at positions corresponding to the terminal sections 52a of the plane coil 52 and the electrode terminals 56 of the semiconductor element 54 by means of irradiating laser beams.

Figure 12:
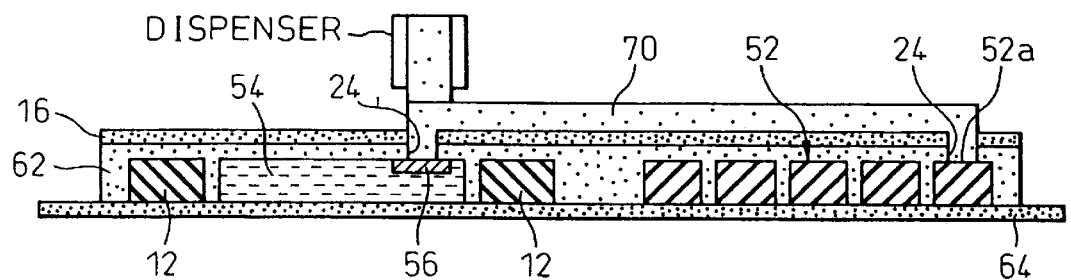

Next, as shown in FIG. 12, on the other face of the insulating resin film 16, the electrically conductive paste 70 is coated between the through-holes 24 from which the electrode terminals 56 of the semiconductor element 54 are exposed and the through-holes 24 from which the terminal sections 52a of the plane coil 52 are exposed in such a manner that the through-holes 24 are filled with the electrically conductive paste 70.

Figure 13:
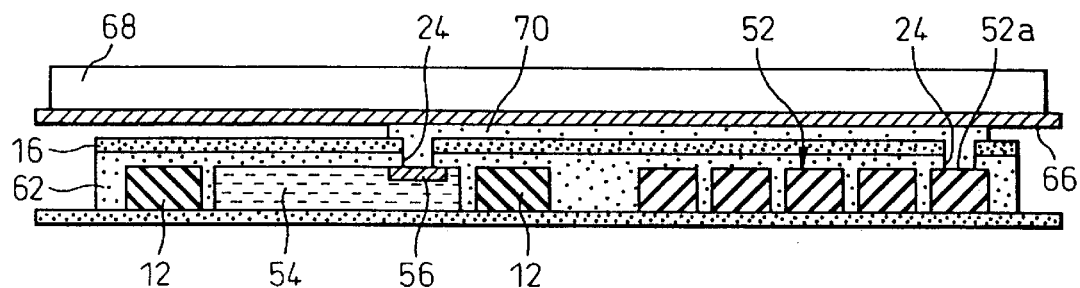

Next, as shown in FIG. 13, in the same manner as that of forming the insulating resin layer 62 described above, the coated electrically conductive paste 70 is crushed and flattened with the plate of glass 68 so as to reduce the thickness. In this connection, this process may be performed when necessary, that is, it is possible to omit this process. Concerning the grade of flattening, in the case where the thickness of the paste layer is 40 to 70 $\mu$m, the paste layer is flattened to the thickness of 15 to 30 $\mu$m.

Figure 14:
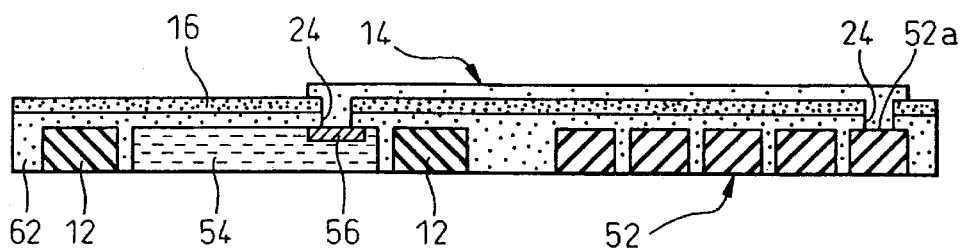

Next, the coated electrically conductive paste 70 is heated and hardened, so that the wiring pattern 14 for electrically connecting the terminal sections 52a of the plane coil 52 with the electrode terminals 56 of the semiconductor element 54 can be formed, as shown in FIG. 14.

(Fourth Embodiment)

Figure 17:
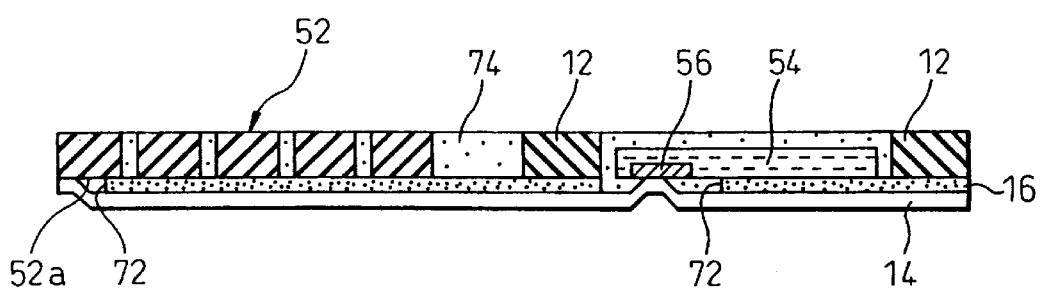

The structure of this embodiment is the same as that of the first embodiment, except for the electrical connection structure of the terminal sections 52a of the plane coil 52 with the electrode terminals 56 of the semiconductor element 54, as will be explained referring to FIG. 17.

On the electrode terminal 56 side of the semiconductor element 54, there is provided an insulating resin film (for example, PET tape) 16, one face of which is directed to the semiconductor element 54 side, on the other face (the lower face in FIG. 17) of which the wiring pattern 14 composed of a layer of conductive metallic foil is formed, in which the relief sections 72 for exposing the wiring pattern 14 to the sides of the terminal sections 52a and the electrode terminal sections are formed at positions corresponding to the terminal sections 52a of the plane coil 52 and the electrode terminals 56 of the semiconductor element 54, in such a manner that the insulating resin film 16 is arranged between the terminal sections 52a of the plane coil 52 and the electrode terminals 56 of the semiconductor element 54. In this connection, each relief section 72 is formed when a portion of the insulating resin film 16 is punched or cut into a window-shape.

Portions of the wiring pattern 14 corresponding to the terminal sections 52a of the plane coil 52 and the electrode terminals 56 of the semiconductor element 54, in other words, portions of the wiring pattern 14 opposed to the terminal sections 52a and the electrode terminals 56 via the relief sections 72 are locally dented onto the side of the relief section 72 (that is, inside of the relief section 72), so that thus dented portions are joined to the terminal sections 52a of the plane coil 52 and the electrode terminals 56 of the semiconductor element 54. In this way, the terminal sections 52a of the plane coil 52 and the electrode terminals 56 of the semiconductor element 54 are electrically connected with each other.

The structure of this embodiment, in plan view, is substantially the same as that shown in FIG. 1.

The method of manufacturing this non-contact type IC card will be explained below. In this connection, in the same manner as that of the explanation of the structure of the non-contact type IC card, only the process for manufacturing the electrical connecting structure, which is different from that described above, will be explained here.

First, in the same manner as that of each embodiment described above, the reinforcing frame 12 is arranged in the periphery of the semiconductor element 54.

Figure 15:
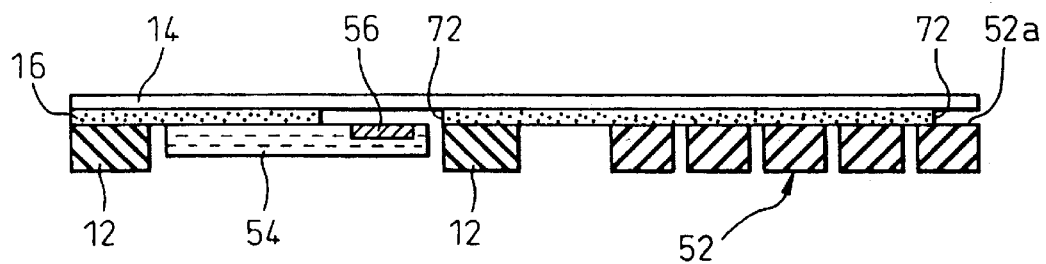
FIGS. 15 to 17 are schematic illustrations for explaining a process for manufacturing the fourth embodiment of the non-contact type IC card of the present invention.

Next, as shown in FIG. 15, on the electrode terminal 56 side of the semiconductor element 54, there is provided an insulating resin film 16, one face of which is directed to the semiconductor element 54 side, on the other face (the lower face in FIG. 17) of which the wiring pattern 14 composed of a layer of conductive metallic foil is formed, in which the relief sections 72 for exposing the wiring pattern 14 to the sides of the terminal sections 52a and the electrode terminal sections are formed at positions corresponding to the terminal sections 52a of the plane coil 52 and the electrode terminals 56 of the semiconductor element 54, in such a manner that the insulating resin film 16 is arranged between the terminal sections 52a of the plane coil 52 and the electrode terminals 56 of the semiconductor element 54.

Figure 16:
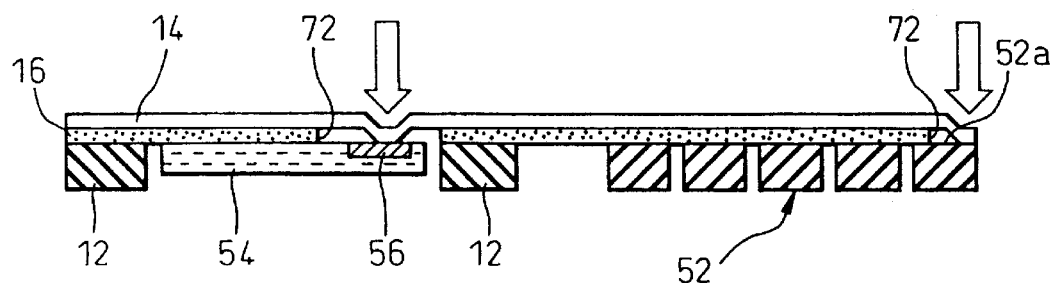

Next, as shown in FIG. 16, portions of the wiring pattern 14, corresponding to the terminal sections 52a of the plane coil 52 and the electrode terminals 56 of the semiconductor element 54, are locally pushed to the relief section 72 side (in the direction of the arrow) so that the portions are dented, and the forward ends of these dented portions of the wiring pattern 14 are contacted with the terminal sections 52a of the plane coil 52 and the electrode terminals 56 of the semiconductor element 54. While the dented portions of the wiring pattern 14 are being pushed against the terminal sections 52a and the electrode terminals 56, ultrasound is applied, so that the wiring pattern 14 can be joined to the terminal sections 52a of the plane coil 52 and the electrode terminals 56 of the semiconductor element 54. Due to the foregoing, the terminal sections 52a of the plane coil 52 and the electrode terminals 56 of the semiconductor element 54 are electrically connected with each other.

Next, from the sides of the reinforcing frame 12, semiconductor element 54 and plane coil 52 opposite to the side on which the electrode terminal 56 of the semiconductor element 54 is formed, thermoplastic resin 74 is coated on the insulating resin film 16 with a dispenser. After coating, the thermoplastic resin 74 is hardened. In this way, the reinforcing frame 12, semiconductor element 54 and plane coil 52 are integrated with the insulating resin film 16.

(Fifth Embodiment)

The essential structure of the non-contact type IC card of this embodiment is substantially the same as the structure of each of the first to the fourth embodiment, except for the structure of the reinforcing frame 12 arranged in the periphery of the semiconductor element 54.

Figure 7:
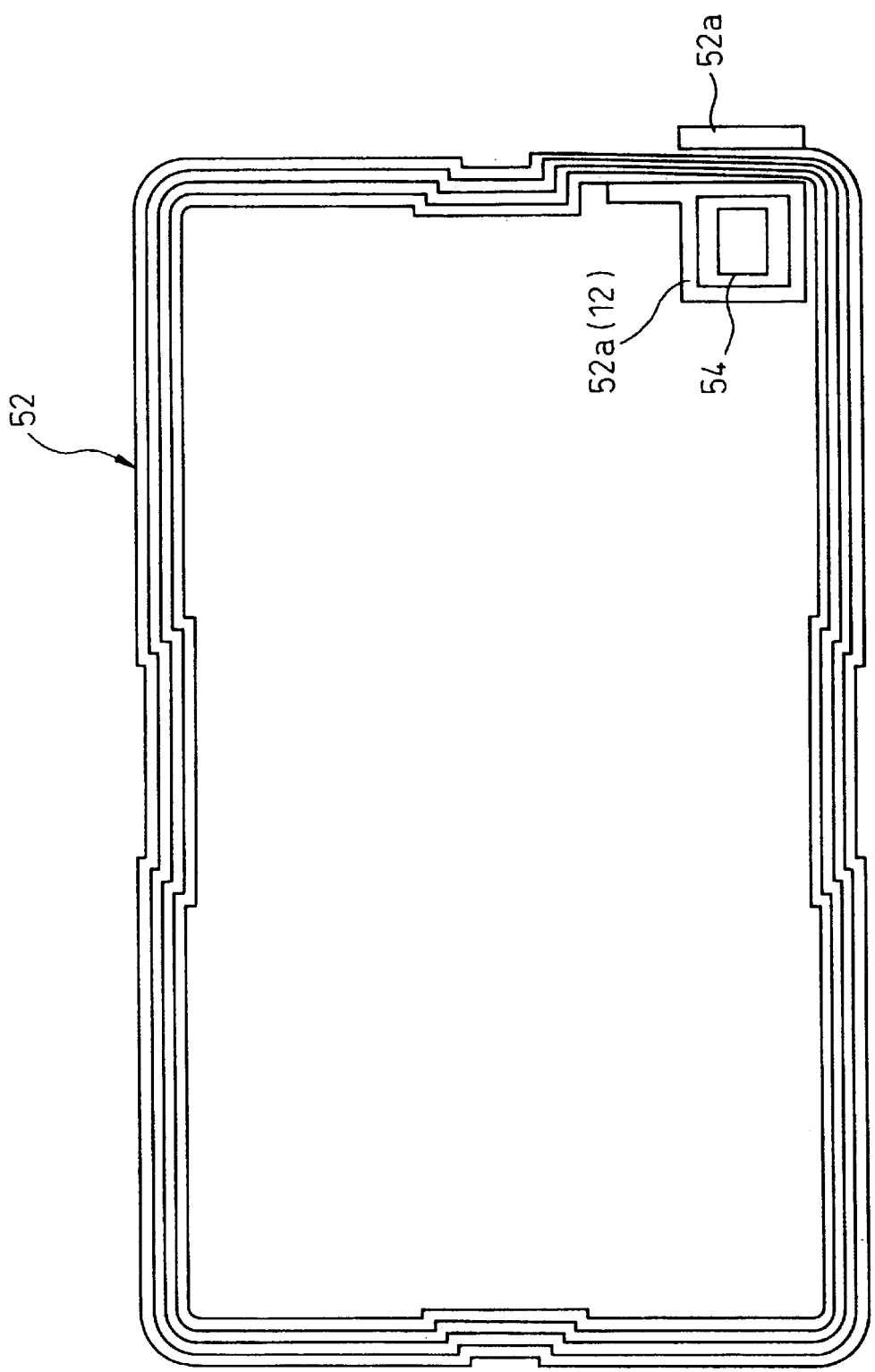
FIG. 7 is a plan view showing the structure of a plane coil used for the fifth embodiment of the non-contact type IC card of the present invention.
Figure 8:
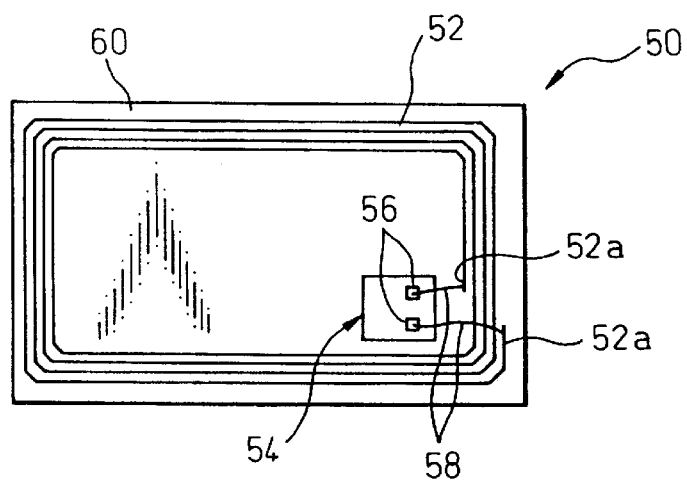
FIG. 8 is a schematic illustration for explaining the structure of a conventional IC card.

The characteristic of this embodiment is described as follows. In the non-contact type IC card of each of the first to the fourth embodiment, the plane coil 52 and the reinforcing frame 12 are made separately from each other. However, in this embodiment, as shown in FIG. 7, one 52a of the terminal sections of the plane coil 52 (in this case, the terminal section located in the inside region) is formed into a frame-shape (for example, a rectangle), and this frame-shaped terminal section 52a is used as the reinforcing frame 12. The semiconductor element 54 is arranged inside this frame-shaped terminal section 52a. It is preferable that the profile of the reinforcing frame 12 is similar to the plane profile of the semiconductor element 54. However, even in the case of a rectangular semiconductor element 54, the profile of the reinforcing frame 12 is not limited to a similar figure, for example, the profile of the reinforcing frame 12 may be a ring or polygon.

In this connection, although not shown in the drawing, the terminal section 52a located in the outside region of the plane coil 52 may be formed into a frame-shape so that it can be used as the reinforcing frame 12.

In the third and the fourth embodiment described above, the inside region of the reinforcing frame 12 can be filled with resin material 26. Due to the foregoing, the reinforcing frame 12, the mechanical strength of which is higher than the semiconductor element 54, and the semiconductor element 54 are integrated into one body by the resin material 26. Therefore, the semiconductor element 54 arranged inside the reinforcing frame 12 can be further protected.

An example in which this structure is applied to the non-contact type IC card of the first embodiment is shown in FIG. 3.

In the first and the second embodiment described before, the resin materials 62, 74 are filled into the inside regions of the reinforcing frames 12. Therefore, the reinforcing frames 12 and the semiconductor elements 54 are integrated with each other by the resin materials 62, 74, and the semiconductor element 54 arranged inside the reinforcing frame 12 can be protected.

In this connection, in the case of the electrical connecting structure of the semiconductor element 54 with the plane coil 52 in the first embodiment, at least the forward end of the bump 22 must protrude from the resin material 26. In the case of the electrical connecting structure of the semiconductor element with the plane coil in the second embodiment, the resin material 26 must be filled so that the electrode terminals 56 of the semiconductor element 54 and the terminal sections 52a of the plane coil 52 can be exposed from the through-holes 24 formed on the insulating resin film 16.

In the case of the electrical connecting structure of the semiconductor element with the plane coil in the fourth embodiment, it is preferable that the surfaces of the electrode terminals 56 of the semiconductor element 54 and the terminal sections 52a of the plane coil 52, against which the wiring pattern 14 is pressed, are plated with gold.

What is claimed is:

1. A non-contact type IC card comprising:
a plane coil having respective terminal sections;
a semiconductor element arranged at a position not overlapping with said plane coil, said semiconductor element having electrode terminals;
means for electrically connecting said respective terminal sections of the plane coil to said electrode terminals of the semiconductor element; and
a reinforcing frame arranged on a face substantially the same as that of said semiconductor element so that said semiconductor element is surrounded by said reinforcing frame.

2. An IC card as set forth in claim 1, wherein said reinforcing frame comprises one of said respective terminal sections which constitutes a frame-like configuration.

3. An IC card as set forth in claim 1, wherein an inside region of said reinforcing frame is filled with a resin.

4. An IC card as set forth in claim 1, wherein said semiconductor element is arranged at a position inside said plane coil.

5. An IC card as set forth in claim 1, wherein said electrical connecting means comprises:

a circuit board extending from said terminal sections of the plane coil to said electrode terminals of the semiconductor element;

said circuit board comprising an insulating resin thin film having first and second surfaces, said first surface facing to said semiconductor element, and circuit patterns formed on said second surface of the insulating resin thin film; and conductive bumps formed on said terminal sections of the plane coil and on said electrode terminals of the semiconductor element, respectively, said bumps projecting through said insulating resin thin film to said circuit patterns, so that said terminal sections of the plane coil are electrically connected to said electrode terminals of the semiconductor element, respectively, by means of said circuit patterns.

6. An IC card as set forth in claim 1, wherein said electrical connecting means comprises:

an insulating resin film extending from said terminal sections of the plane coil to said electrode terminals of the semiconductor element, said insulating resin film having first and second surfaces, said first surface facing to said semiconductor element, said insulating resin film also having through holes at positions corresponding to said terminal sections of the plane coil and said electrode terminals of the semiconductor element;

circuit patterns, composed of conductive paste, formed on said second surface of the insulating resin film and having respective ends filled in said through holes, respectively, so that said terminal sections of the plane coil are electrically connected to said electrode terminals of the semiconductor element by means of said circuit patterns.

7. An IC card as set forth in claim 1, further comprising:

an electrical insulating layer for covering said reinforcing frame, said semiconductor element and said plane coil, at a side of said electrode terminals of the semiconductor element; and said electrical connecting means comprising:

an insulating resin film formed on said insulating layer and extending from said terminal sections of the plane coil to said electrode terminals of the semiconductor element; said insulating resin film having first and second surfaces, said first surface facing to said semiconductor element;

said electrically insulating layer and said insulating resin film having through holes, penetrating therethrough, at positions corresponding to said terminal sections of the plane coil and said electrode terminals of the semiconductor element;

circuit patterns, composed of conductive paste, formed on said second surface of the insulating resin film and having respective ends filled in said through holes, respectively, so that said terminal sections of the plane coil are electrically connected to said electrode terminals of the semiconductor element by means of said circuit patterns.

8. An IC card as set forth in claim 1, wherein said electrical connecting means comprises:

an insulating resin thin film extending from said terminal sections of the plane coil to said electrode terminals of the semiconductor element, said insulating resin film having first and second surfaces, said first surface facing to said semiconductor element;

said insulating resin film having relief portions at positions corresponding to said terminal sections of the plane coil and said electrode terminals of the semiconductor element;

circuit patterns, composed of conductive metal foil, formed on said second surface of the insulating resin film and having respective portions pushed toward said terminal sections of the plane coil and said electrode terminals of the semiconductor element through said relief portions of the insulating resin film, so that said terminal sections of the plane coil are electrically connected to said electrode terminals of the semiconductor element by means of said circuit patterns.

9. A plane coil adapted to be used in a non-contact type IC card including at least one semiconductor element, said plane coil comprising:

respective terminal sections, at least one of said terminal sections being formed as a reinforcing frame, so that said semiconductor element can be arranged in such a manner that said semiconductor element is surrounded by said reinforcing frame.

* * * * *